(12) United States Patent
Cai et al.

(10) Patent No.: US 8,643,120 B2
(45) Date of Patent: Feb. 4, 2014

(54) FINFET WITH FULLY SILICIDED GATE

(75) Inventors: Ming Cai, Hopewell Junction, NY (US);
Dechao Guo, Fishkill, NY (US);
Chun-chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/345,233

(22) Filed: Jan. 6, 2012

(65) Prior Publication Data
US 2013/0175620 A1 Jul. 11, 2013

(51) Int. Cl.
*H01L 27/088* (2006.01)
*H01L 27/12* (2006.01)
*H01L 21/336* (2006.01)
*H01L 21/84* (2006.01)

(52) U.S. Cl.
USPC .......... 257/401; 257/347; 257/E21.703; 257/E27.112; 438/300; 438/303; 438/157; 438/283

(58) Field of Classification Search
USPC ......... 257/E21.626, E21.64, E27.112, 347, 257/E21.409, 401, E21.703; 438/163, 438/303–307, 300, 157, 283
See application file for complete search history.

(56) References Cited

U.S. PATENT DOCUMENTS

| 7,105,390 | B2 * | 9/2006 | Brask et al. | 438/149 |
| 7,399,664 | B1 * | 7/2008 | Anderson et al. | 438/157 |
| 7,410,854 | B2 | 8/2008 | Yao et al. | |
| 7,416,943 | B2 | 8/2008 | Figura et al. | |
| 7,465,634 | B2 | 12/2008 | Lim et al. | |
| 7,598,572 | B2 | 10/2009 | Dyer et al. | |
| 7,646,070 | B2 * | 1/2010 | Anderson et al. | 257/401 |

(Continued)

FOREIGN PATENT DOCUMENTS

| EP | 1 724 818 A2 | 11/2006 |
| JP | 2008172237 | 7/2008 |
| JP | 2009064853 | 3/2009 |

OTHER PUBLICATIONS

T. Ghani et al., "A 90 nm High Volume Manufacturing Logic Technology Featuring Novel 45 nm Gate Length Strained Silicon CMOS Transistors," IEDM 2003, pp. 978-980.
H.S. Yang et al., "Dual Stress Liner for High Performance Sub-45nm Gate Length SOI CMOS Manufacturing," IEDM 2004, pp. 1075-1077.
M. Horstmann et al., "Integration and Optimization of Embedded SiGe, Compressive and Tensile Stressed Liner Films, and Stress Memorization in Advanced SOI CMOS Technologies," IEDM 2005, pp. 233-236.

(Continued)

*Primary Examiner* — Mary Wilczewski
*Assistant Examiner* — Erik T Peterson
(74) *Attorney, Agent, or Firm* — Thomas Grzesik; Fleit Gibbons Gutman Bongini & Bianco PL

(57) ABSTRACT

A method is provided for fabricating a finFET device. Multiple fin structures are formed over a BOX layer, and a gate stack is formed on the BOX layer. The fin structures each include a semiconductor layer and extend in a first direction, and the gate stack is formed over the fin structures and extends in a second direction. The gate stack includes dielectric and polysilicon layers. Gate spacers are formed on vertical sidewalls of the gate stack, and an epi layer is deposited over the fin structures. Ions are implanted to form source and drain regions, and the gate spacers are etched so that their upper surface is below an upper surface of the gate stack. After etching the gate spacers, silicidation is performed to fully silicide the polysilicon layer of the gate stack and to form silicide regions in an upper surface of the source and drain regions.

15 Claims, 6 Drawing Sheets

(56) References Cited

U.S. PATENT DOCUMENTS

| | | | |
|---|---|---|---|
| 7,659,561 B2 | 2/2010 | Kwon | |
| 7,666,790 B2 | 2/2010 | Luo et al. | |
| 7,825,481 B2 | 11/2010 | Chau et al. | |
| 7,851,865 B2 | 12/2010 | Anderson et al. | |
| 2006/0057802 A1* | 3/2006 | Nowak et al. | 438/206 |
| 2006/0261411 A1 | 11/2006 | Hareland et al. | |
| 2008/0067613 A1 | 3/2008 | Anderson et al. | |
| 2008/0111163 A1* | 5/2008 | Russ et al. | 257/280 |
| 2008/0230852 A1 | 9/2008 | Yu et al. | |
| 2009/0152623 A1* | 6/2009 | Goto et al. | 257/329 |
| 2009/0152638 A1 | 6/2009 | Belyansky et al. | |
| 2009/0302372 A1* | 12/2009 | Chang et al. | 257/327 |
| 2010/0264497 A1* | 10/2010 | Chang et al. | 257/393 |
| 2011/0001169 A1* | 1/2011 | Ozcan et al. | 257/213 |

OTHER PUBLICATIONS

A. Yagishita, "FinFET SRAM Process Technology for hp32 nm Mode and Beyond," IEEE International Conference on Integrated Circuit Design and Technology, 2007, ICICDT07, pp. 1-4.

H. Shang et al., "Investigation of FinFET Devices for 32 nm Technologies and Beyond," IEEE 2006 Symposium on VLSI Technology Digest of Technical Papers, Oct. 2006, pp. 54-55.

H. Kawasaki et al., "Challenges and Solutions of FinFET Integration in an SRAM Cell and a Logic Circuit for 22 nm Node and Beyond," IEDM 2009, pp. 289-292.

S. Bangsaruntip et al., "High Performance and High Uniform Gate-All-Around Silicon Nanowire MOSFETs with Wire Size Dependent Scaling," IEDM 2009, pp. 297-300.

\* cited by examiner

FINFET WITH FULLY SILICIDED GATE

FIELD OF THE INVENTION

The present invention generally relates to the field of semiconductors, and more particularly relates to fin field effect transistors (finFETs) with a fully silicided gate.

BACKGROUND OF THE INVENTION

Fin field effect transistors (finFETs) are leading candidates to enable the scaling of gate lengths to 25 nm and below. When using finFETs, it is desirable to lower the gate resistance to improve performance characteristics such as the effective AC resistance (AC $R_{eff}$) and the maximum operating frequency (RF $f_{max}$). One approach to lowering the gate resistance is polysilicon pre-doping. Pre-doping the polysilicon with boron or arsenic and then performing a rapid thermal anneal (RTA) is commonly used in fabricating planar CMOS devices. However, with the 3D structure of a fin FET, it is difficult to achieve a uniform high doping concentration down to the line in-between the fins through such a conventional implant and thermal diffusion. Additionally, this requires an extra mask step to form both nFET and pFET devices formed.

Another approach to lowering the gate resistance is increasing the thickness of the gate silicide. The thickness of the gate silicide can be increased by increasing the initial nickel platinum (NiPt) deposition thickness or by performing RTA at a higher temperature. However, both of these methods for increasing the thickness of the gate silicide also increase the thickness of the silicide in the source/drain regions. This leads to silicide encroachment and increased junction leakage.

SUMMARY OF THE INVENTION

One embodiment of the present invention provides a method for fabricating a finFET device. According to the method, multiple fin structures are formed over a buried insulator (BOX) layer, and a gate stack is formed on the BOX layer. The fin structures each include a semiconductor layer and extend in a first direction, and the gate stack is formed over the fin structures and extends in a second direction. The gate stack includes a dielectric layer and a polysilicon layer. Gate spacers are formed on vertical sidewalls of the gate stack, and an epitaxial silicon (epi) layer is deposited over the fin structures to merge the fin structures together. Ions are implanted to form source and drain regions in the fin structures, and the gate spacers are etched so that an upper surface of the gate spacers is below an upper surface of the gate stack. After etching the gate spacers, silicidation is performed to fully silicide the polysilicon layer of the gate stack and to form silicide regions in an upper surface of the source and drain regions.

Another embodiment of the present invention provides a finFET device. The finFET device includes a buried insulator (BOX) layer, multiple fin structures over the BOX layer, a gate stack located on the BOX layer, and gate spacers located on vertical sidewalls of the gate stack. The fin structures each include a semiconductor layer and extend in a first direction, and the gate stack is formed over the fin structures and extends in a second direction. The gate stack includes a dielectric layer and a second layer, and an upper surface of the gate spacers is below an upper surface of the gate stack. The device further includes an epitaxial silicon (epi) layer merging the fin structures together, source and drain regions located in the fin structures, and silicide regions located in an upper surface of the source and drain regions. The second layer of the gate stack is fully silicided.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION

Preferred embodiments of the present invention will be described in detail hereinbelow with reference to the attached drawings.

Embodiments of the present invention provide fin field effect transistors (finFETs) with a fully silicided gate. The gate spacers are pulled down prior to silicidation. By partially removing the gate spacers from the gate sidewall prior to silicidation, the polysilicon layer of the gate of the finFET can be fully silicided during the silicidation process without increasing the thickness of the silicide in the source/drain regions. Thus, the gate resistance is lowered without increasing junction leakage. Additionally, there is a concurrent stress benefit from liner proximity.

Figure 1:
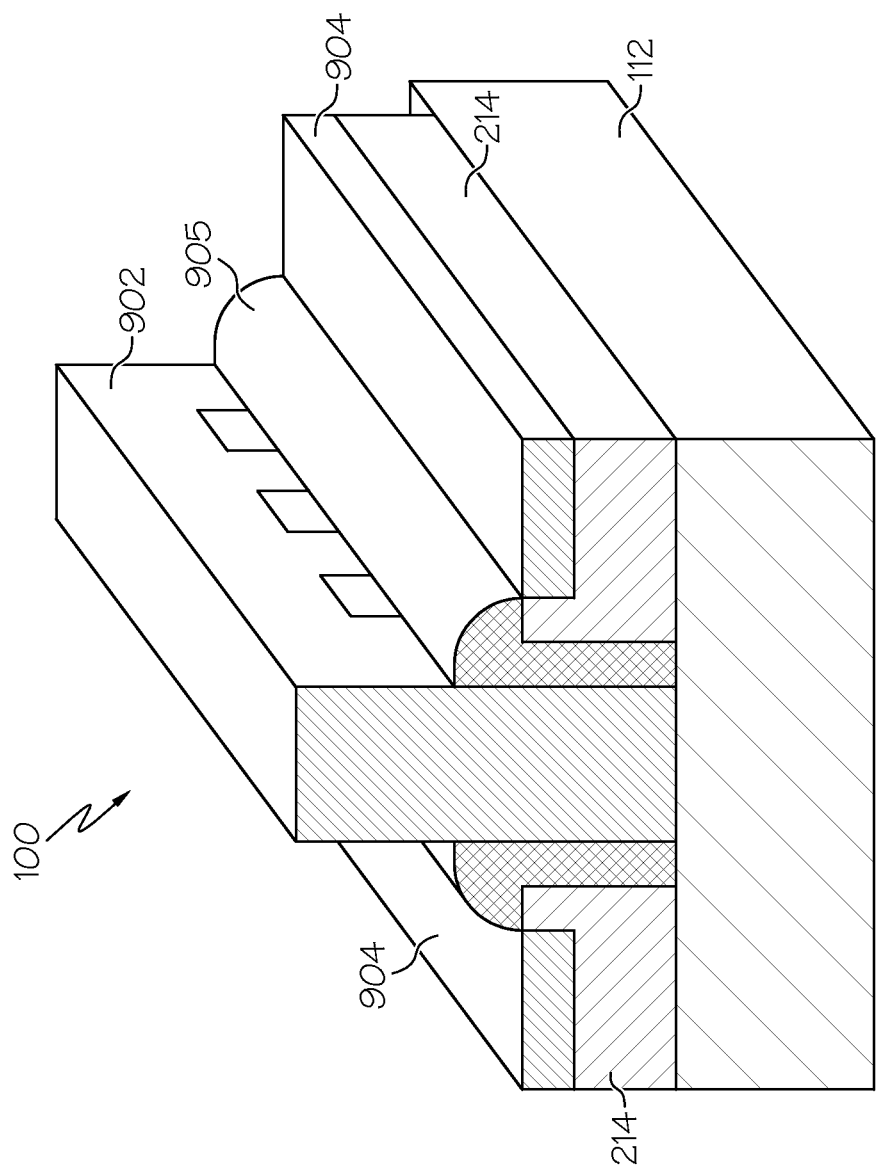
FIG. 1 illustrates a finFET device according to one embodiment of the present invention.

FIG. 1 shows a finFET device according to one embodiment of the present invention. The finFET device 100 is formed on a silicon-on-insulator (SOI) substrate. The SOI substrate includes a semiconductor layer disposed on a buried insulator (BOX) layer 112, which is disposed on a semiconductor substrate. In another embodiment, the finFET device is formed on a bulk silicon substrate.

The finFET device 100 includes a gate stack disposed on a hardmask 104 (i.e., dielectric). The gate stack of this embodiment is a fully silicided gate 902 that includes a fully silicided polysilicon layer, a metal gate, and a high-K layer. Source/drain regions 214 are provided, with the gate stack 902 being located between the source/drain regions 214. Gate spacers 905 with an inverted-L shape are located on the vertical sidewalls of the gate stack 102.

In this embodiment, the gate spacers 905 are formed of one or more layers of silicon nitride (SiN) and/or silicon oxide ($SiO_2$). Silicide regions 904 are formed in an upper portion of the source/drain regions 214. An upper surface of the gate spacers 905 reaches less than half the height of the gate 902 above the top surface of the source/drain regions. In one embodiment, the upper surface of the gate spacers is near the top surface of the source/drain regions (e.g., ⅛ or less the height of the gate above the top surface of the source/drain regions).

Figure 3:
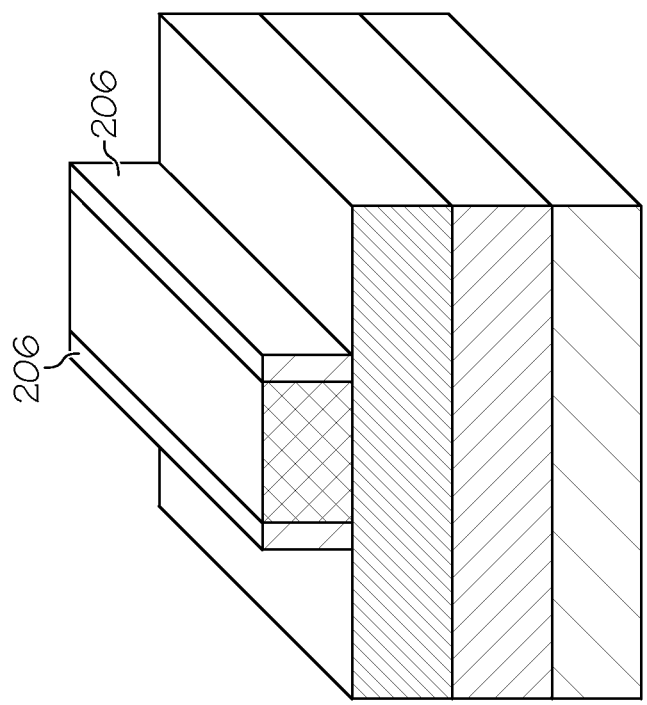
FIG. 3 illustrates silicon nitride structures formed on the sides of the polysilicon structure during the fabrication process of the first embodiment.
Figure 2:
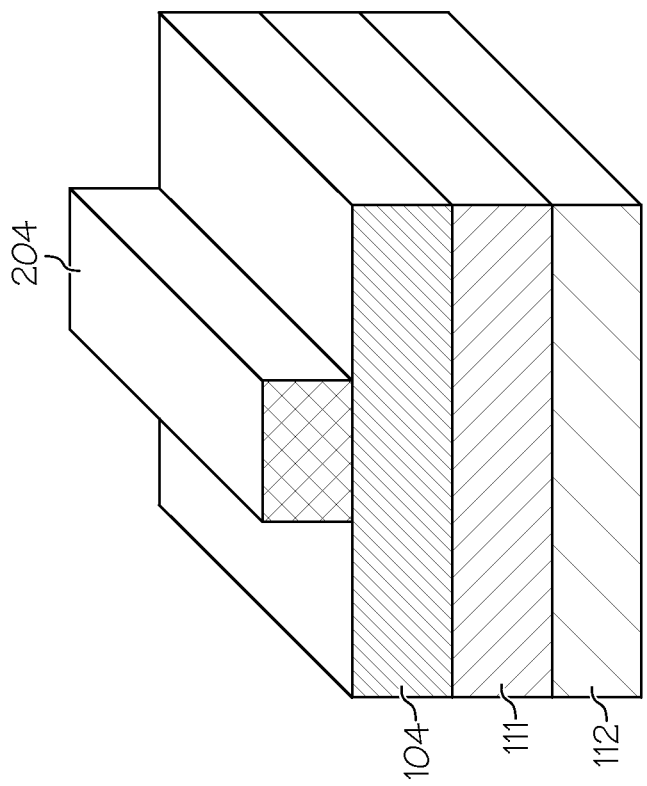
FIG. 2 illustrates a polysilicon structure formed above an SOI substrate during a process for fabricating a finFET device in accordance with a first embodiment of the present invention.

FIGS. 2-11 illustrate a process for fabricating the finFET device of FIG. 1 according to one embodiment of the present invention. The process begins with an SOI substrate that includes a semiconductor layer 111 (e.g., a silicon layer) disposed on a buried insulator (BOX) layer 112 (e.g., an oxide layer). As shown in FIG. 2, a hardmask (dielectric) layer 104 is formed on the semiconductor layer 111. The hard mask layer 104 of this embodiment is silicon dioxide ($SiO_2$) or silicon nitride (SiN). A polysilicon structure 204 is deposited on the hardmask layer 104 and then etched. As shown in FIG. 3, silicon nitride removable structures 206 are formed on the vertical sidewalls of the polysilicon structure 204 through a standard deposition and etching process.

Figure 5:
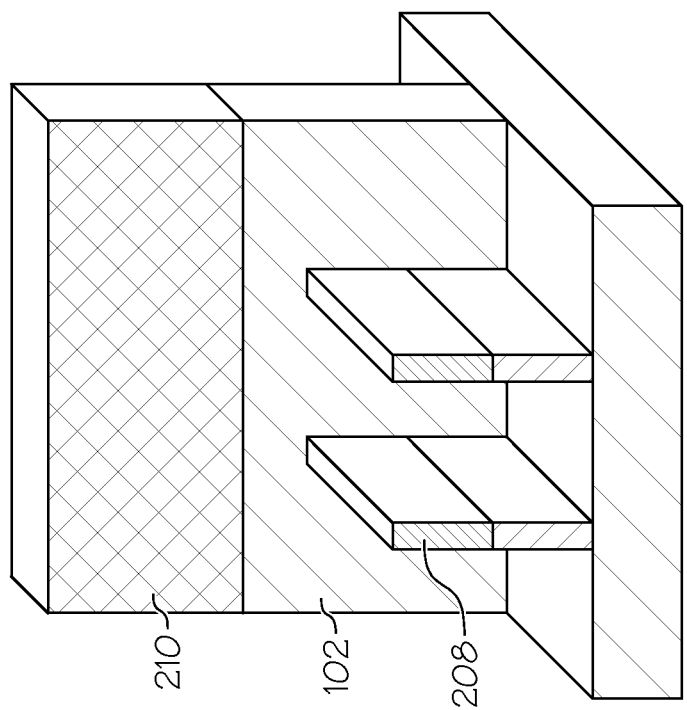
FIG. 5 illustrates formation of a gate stack perpendicular to the fin structures during the fabrication process of the first embodiment.
Figure 4:
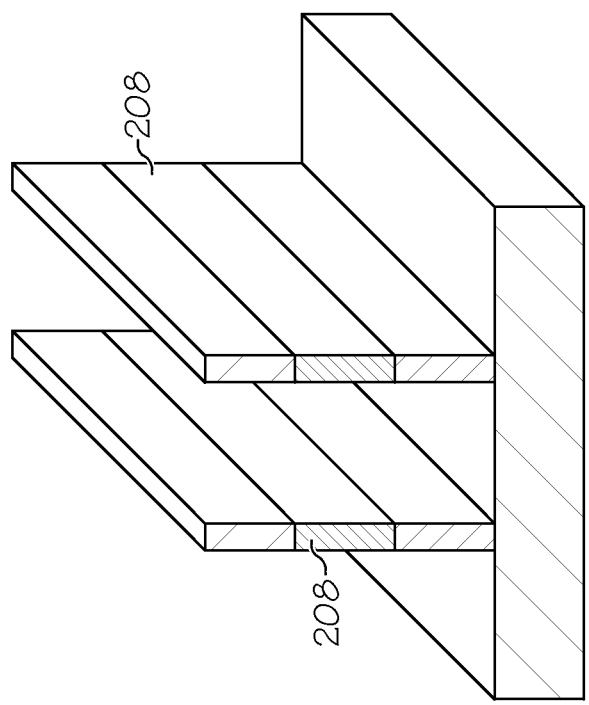
FIG. 4 illustrates the formation of fin structures during the fabrication process of the first embodiment.

As shown in FIG. 4, the polysilicon structure 204 is removed, and the hardmask and semiconductor layers 104 and 111 are etched to form fin structures 208. The removable structures 206 are then removed, as shown in FIG. 5. This produces fin structures 208 that are formed by the portions of the hardmask layer 104 and semiconductor layer 111 that were located under the removable structures 206. In another embodiment, the dielectric 208 is removed to form the trigate structure.

Figure 6:
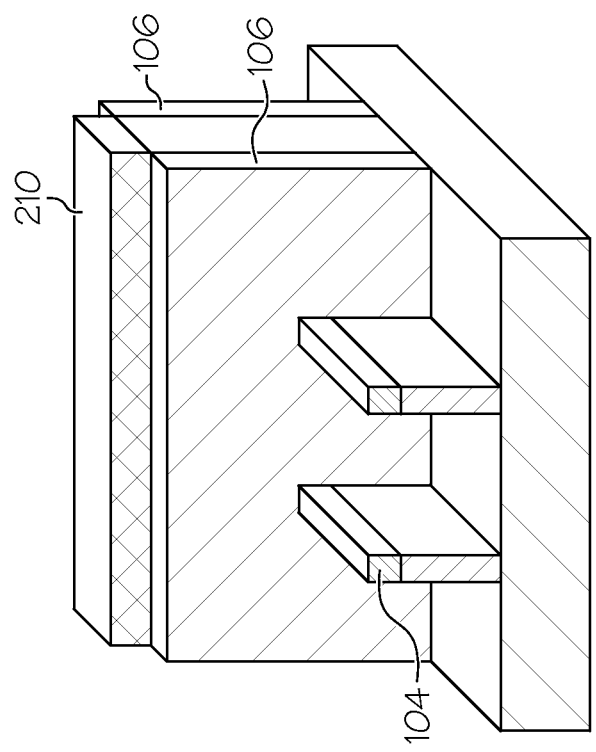
FIG. 6 illustrates gate spacers formed along the sides of the gate stack during the fabrication process of the first embodiment.

A gate stack 102 is formed on the BOX layer 112 perpendicular to the fin structures 208, and an SiN layer 210 is formed on the gate stack 102. The gate stack 102 of this embodiment includes a polysilicon layer, a metal gate, and a high-K layer (e.g., $HfO_2$). In this illustrative embodiment, the gate length ($L_{gate}$) is about 25 nm or less. Next, as shown in FIG. 6, upper portions of the hardmask layer 104 and the SiN layer 210 are removed. Gate spacers 106 are formed along the vertical sidewalls of the gate stack 102. Optionally, ions are then implanted to form source and drain extension regions that extend under the spacer.

Figure 7:
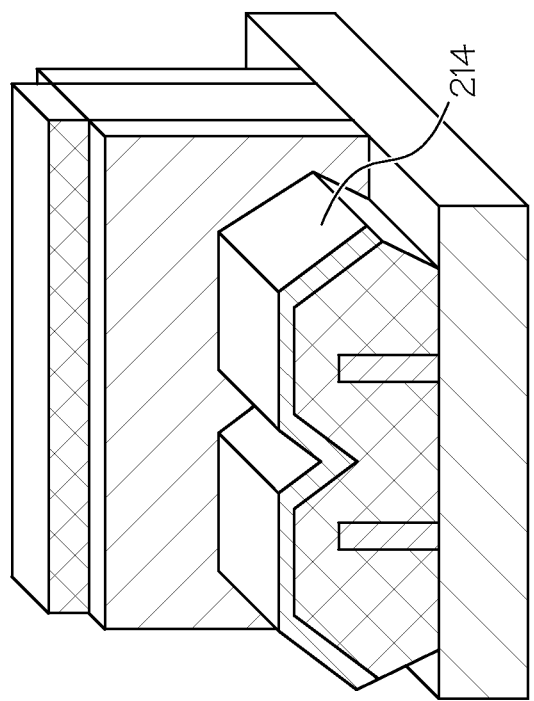
FIG. 7 illustrates an epitaxial silicon layer deposited over the fin structures during the fabrication process of the first embodiment.

An epitaxial silicon (epi) layer 214 is then deposited over the fin structures 208, as shown in FIG. 7. In the illustrated embodiment, the epi layer is an undoped or in-situ doped epitaxial film with a thickness of about 30 nm, and the polysilicon layer of the gate extends about 40 nm above the top surface of the epi layer 214. The epi layer 214 creates uniform extensions on the fins so as to merge the individual fin structures 208 together. The use of in-situ doped films enables uniform junction formation, which results in a reduction in resistance. An in-situ doped epi layer provides conformal doping of the devices, reduces the resistance, and significantly improves performance. In an alternative embodiment, a silicon germanium (SiGe) cladding is deposited over the fins instead of the epi layer.

Ions are then implanted into the semiconductor layer 111 to form source and drain regions. The result of epi formation and ion implantation is a finFET device with merged source/drain regions S and D. A channel region is located between the source/drain regions S and D. Next, second spacers 109 are formed on the vertical sidewalls of the gate spacers 106. The second spacers 109 extend to the top surface of the epi layer 214 of the merged source/drain regions. In this embodiment, the second spacers 109 are formed of one or more layers of silicon nitride (SiN) and/or silicon oxide ($SiO_2$). The gate spacers 106 and the second spacers 109 can be formed of the same or different materials.

Figure 8:
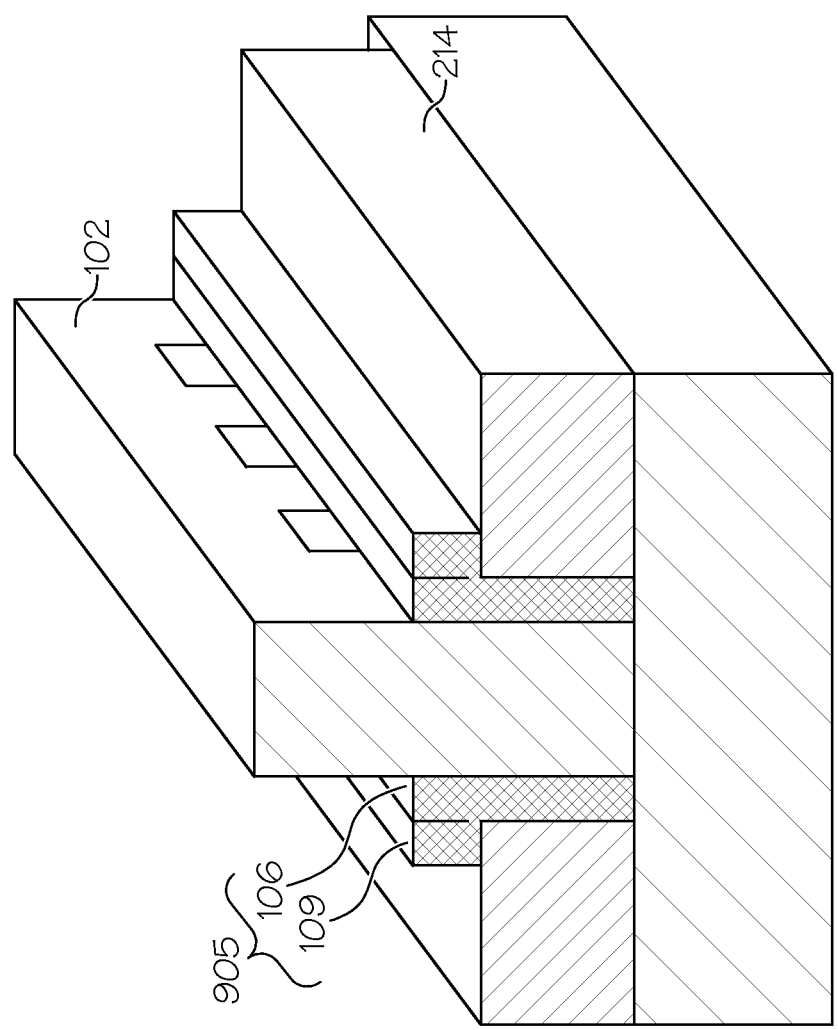
FIG. 8 illustrates the spacers pulled down prior to silicidation during the fabrication process of the first embodiment.
Figure 9:
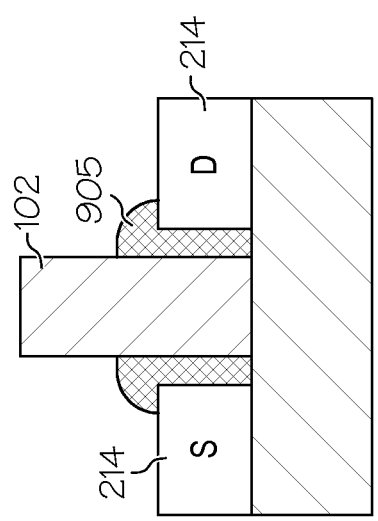
FIG. 9 is a cross-sectional view illustrating the spacers pulled down prior to silicidation during the fabrication process of the first embodiment.

As shown in FIG. 8, an etch is then performed to pull down the gate spacers 106 and the second spacers 109. In this illustrative embodiment, the spacers 106 and 109 are pulled down to near the top surface of the epi layer (e.g., about 5 nm or less from the top surface of the epi layer). The remaining portions of the spacers combine to form spacers 905 with an inverted-L shape profile, as shown in FIGS. 8 and 9. In another embodiment, the spacers are pulled down by at least half of the height of the gate 102 above the top surface of the epi layer 214 (e.g., pulled down by at least about 20 nm). The spacers can be etched by adjusting the overetch time before silicidation.

Figure 11:
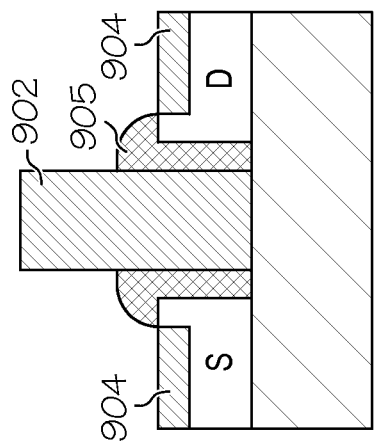
FIG. 11 is a cross-sectional view illustrating a fully silicided gate during the process of the first embodiment.
Figure 10:
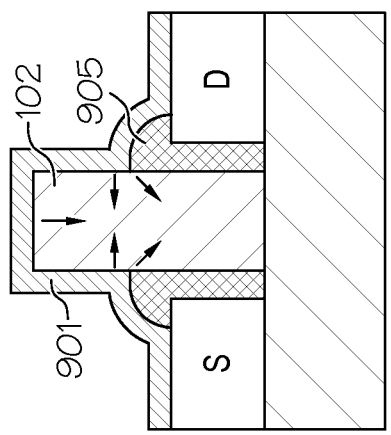
FIG. 10 is a cross-sectional view illustrating silicidation during the fabrication process of the first embodiment.

Next, silicidation is performed. As shown in FIG. 10, metal 901 (e.g., NiPt) is deposited over the structure. RTA is then performed to diffuse the deposited metal and form silicide regions. During RTA, there is vertical diffusion of the metal into the top surfaces of the gate 102 and source/drain regions 214. And because the spacers were pulled down prior to silicidation, there is also horizontal diffusion of the metal into the vertical sidewalls of the polysilicon layer of the gate 102. The result is silicide regions 904 in the upper portions of the source/drain regions 214, and a polysilicon layer of the gate that is fully silicided 902, as shown in FIGS. 1 and 11. The silicide on the source/drain regions is much shallower than on the gate. In the illustrated embodiment, a nickel platinum silicide is formed. In further embodiments, the silicide is formed using nickel, platinum, titanium, cobalt, or a combination or alloy thereof.

By pulling down the spacers 902 by at least half of the height of the gate above the top surface of the epi layer 214 prior to silicidation, the additional horizontal diffusion into the vertical sidewalls of the gate can operate to convert the entire polysilicon layer of the gate to form the fully silicided gate (i.e., silicide down to the metal gate layer). The full silicidation of the gate is better assisted by pulling down the gate to nearer to (e.g., 5 nm or less) the top surface of the epi layer. Full silicidation is also assisted by reducing the height of the polysilicon layer, depositing a thicker metal layer, or performing RTA at a higher temperature. While there are performance-based reasons to limit the use of such alterations as explained above, more conservative use of one or more of these in addition to pulling down the gate spacers prior to silicidation can enhance full silicidation without producing the same drawbacks because the silicide on the source/drain regions is much shallower than on the gate.

Conventional fabrication steps are then performed to form the remainder of the integrated circuit that includes this finFET. For example, a stress liner is formed, contacts are formed on the silicide regions, and then metal lines are formed.

Accordingly, embodiments of the present invention provide a finFET device with a fully silicided gate. The gate spacers are pulled down prior to silicidation. By at least partially removing the gate spacers from the gate sidewall prior to silicidation, there is both vertical and horizontal diffusion into the polysilicon layer of the gate during silicidation. This allows the polysilicon layer of the gate of the finFET to be fully silicided during the silicidation process without increasing the thickness of the silicide in the source/drain regions. Thus, the gate resistance is lowered without increasing junction leakage. From an intrinsic device point of view, the fully silicided gate provides significantly better $f_{max}$, $f_{CROSS}$, $f_{min}$, and $R_N$ at a lower finger width. The device is particularly well suited for ultralow-power/low-noise RF applications.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A finFET device comprising:
   a buried insulator (BOX) layer;
   a plurality of fin structures over the BOX layer, the fin structures each comprising a semiconductor layer and extending in a first direction;
   a gate stack located on the BOX layer, the gate stack being formed over the fin structures and extending in a second direction that is perpendicular to the first direction, the gate stack comprising a dielectric layer and a second layer;
   at least one gate spacer located on vertical sidewalls of the gate stack, an upper surface of the at least one gate spacer being below an upper surface of the gate stack, wherein a first portion of the at least one gate spacer above an upper surface of the fin structures comprises a width that is greater than a width of a second portion of the at least one gate spacer below the upper surface of the fin structures;
   source and drain regions located in the fin structures; and
   silicide regions located in an upper surface of the source and drain regions, wherein the second layer of the gate stack is fully silicided.

2. The finFET device of claim 1, wherein the first portion of the at least one gate spacer and the second portion of the at least one gate spacer together have an inverted-L shape on the vertical sidewalls of the gate stack.

3. The finFET device of claim 1, wherein the silicide regions in the upper surface of the source and drain regions are much shallower than a silicide region of the gate stack.

4. The finFET device of claim 1, further comprising:
   an epitaxial silicon (epi) layer merging the fin structures together.

5. The finFET device of claim 4, wherein the upper surface of the at least one gate spacer is less than half the height of the gate stack above an upper surface of the epi layer.

6. The finFET device of claim 4, wherein the upper surface of the at least one gate spacer is ⅛ or less a height of the gate stack above the upper surface of the epi layer.

7. The finFET device of claim 4, wherein the at least one gate spacer is about 5 nm or less from an upper surface of the epi layer.

8. An integrated circuit comprising a plurality of finFET devices, at least one of the finFET devices comprising:
- a buried insulator (BOX) layer;
- a plurality of fin structures over the BOX layer, the fin structures each comprising a semiconductor layer and extending in a first direction;
- a gate stack located on the BOX layer, the gate stack being formed over the fin structures and extending in a second direction that is perpendicular to the first direction, the gate stack comprising a dielectric layer and a second layer;
- at least one gate spacer located on vertical sidewalls of the gate stack, an upper surface of the at least one gate spacer being below an upper surface of the gate stack, wherein a first portion of the at least one gate spacer above an upper surface of the fin structures comprises a width that is greater than a width of a second portion of the at least one gate spacer below the upper surface of the fin structures;
- source and drain regions located in the fin structures; and
- silicide regions located in an upper surface of the source and drain regions, wherein the second layer of the gate stack is fully silicided.

9. The integrated circuit of claim 8, wherein the first portion of the at least one gate spacer and the second portion of the at least one gate spacer together have an inverted-L shape on the vertical sidewalls of the gate stack.

10. The integrated circuit of claim 8, wherein the silicide regions in the upper surface of the source and drain regions are much shallower than a silicide region of the gate stack.

11. The integrated circuit of claim 8, wherein the least one of the finFET devices further comprises:
- an epitaxial silicon (epi) layer merging the fin structures together.

12. The integrated circuit of claim 11, wherein the upper surface of the at least one gate spacer is less than half the height of the gate stack above an upper surface of the epi layer.

13. The integrated circuit of claim 11, wherein the upper surface of the at least one gate spacer is ⅛ or less a height of the gate stack above the upper surface of the epi layer.

14. The integrated circuit of claim 11, wherein the at least one gate spacer is about 5 nm or less from an upper surface of the epi layer.

15. A finFET device comprising:
- a buried insulator (BOX) layer;
- a plurality of fin structures over the BOX layer, the fin structures each comprising a semiconductor layer and extending in a first direction;
- a gate stack located on the BOX layer, the gate stack being formed over the fin structures and extending in a second direction that is perpendicular to the first direction, the gate stack comprising a dielectric layer and a second layer;
- gate spacers located on vertical sidewalls of the gate stack, an upper surface of the gate spacers being below an upper surface of the gate stack;
- second spacers located on vertical sidewalls of the gate spacers, wherein the gate spacers and the second spacers together have an inverted-L shape on the vertical sidewalls of the gate stack;
- an epitaxial silicon (epi) layer merging the fin structures together;
- source and drain regions located in the fin structures; and
- silicide regions located in an upper surface of the source and drain regions, wherein the second layer of the gate stack is fully silicided.

* * * * *